(12) United States Patent
Boswell

(10) Patent No.: US 7,152,659 B2
(45) Date of Patent: Dec. 26, 2006

(54) COMPONENT CASTING

(75) Inventor: John H. Boswell, Derby (GB)

(73) Assignee: Rolls-Royce, PLC, London (GB)

( * ) Notice: Subject to any disclaimer, the term of this patent is extended or adjusted under 35 U.S.C. 154(b) by 0 days.

(21) Appl. No.: 11/378,278

(22) Filed: Mar. 20, 2006

(65) Prior Publication Data
US 2006/0157220 A1  Jul. 20, 2006

Related U.S. Application Data

(63) Continuation of application No. 10/781,832, filed on Feb. 20, 2004.

(30) Foreign Application Priority Data
Feb. 26, 2003 (GB) .................. 0304327.0

(51) Int. Cl.
B22C 9/02 (2006.01)

(52) U.S. Cl. .................. 164/361

(58) Field of Classification Search ............. 164/122.1, 164/122.2, 361
See application file for complete search history.

(56) References Cited

U.S. PATENT DOCUMENTS

| 3,706,338 | A | * | 12/1972 | Barrow et al. ............. 164/357 |
| 4,773,467 | A | * | 9/1988 | Graham et al. .......... 164/122.1 |
| 4,862,947 | A | | 9/1989 | Horton et al. |
| 5,269,365 | A | | 12/1993 | Lallement et al. |
| 5,275,227 | A | | 1/1994 | Staub |
| 5,353,860 | A | | 10/1994 | Staub et al. |
| 5,404,930 | A | | 4/1995 | Stanton et al. |
| 5,868,194 | A | | 2/1999 | Horwood |
| 6,170,560 | B1 | * | 1/2001 | Daily et al. .................. 164/516 |
| 6,276,432 | B1 | * | 8/2001 | Thompson et al. ...... 164/122.1 |
| 2002/0005265 | A1 | | 1/2002 | Ford |

FOREIGN PATENT DOCUMENTS

| EP | 0 059 550 A2 | * | 9/1982 |
| EP | 0 787 547 A1 | | 8/1997 |
| GB | 2 259 660 A | * | 3/1993 |
| GB | 2 266 066 A | | 10/1993 |
| JP | 54-5822 | | 1/1979 |
| JP | A 56-119641 | | 9/1981 |
| JP | 59-174265 A | * | 10/1984 |
| JP | A-59-174265 | | 10/1984 |
| WO | WO 00/76695 A1 | | 12/2000 |

* cited by examiner

Primary Examiner—Kevin P. Kerns
(74) Attorney, Agent, or Firm—Oliff & Berridge, PLC

(57) ABSTRACT

A deflector element is provided, in order to improve temperature interface control with respect to directional solidification of a component casting. This deflector element is formed during the mould making process and is arranged to be positioned with respect to a part of a principal mould formation within which the final cast component is produced. The deflector element ensures a uniform temperature throughout the component cross-section relative to other parts of the component as it is solidified.

8 Claims, 3 Drawing Sheets

COMPONENT CASTING

This is a Continuation of application Ser. No. 10/781,832 filed Feb. 20, 2004. The disclosure of the prior application is hereby incorporated by reference herein in its entirety.

BACKGROUND

The present invention relates to component casting and more particularly but not exclusively to component casting of directional solidification or single crystal components for engines such as blades, seal segments and nozzle guide vanes.

Component casting is used in order to produce a wide range of components and members. Essentially, the component is cast in a mould from a molten liquid and then allowed to cool in order to leave a solidified component. Some components such as turbine blades for jet engines require structural abilities such as high temperature creep resistant. This is achieved with turbine blades through forming a single crystal. At high temperatures, typically above half the absolute melting temperature of the metal, the grain boundaries become weaker than the grain bodies such that the absence of such grain boundaries in a single crystal provides resistance to creep.

Techniques for producing single crystal components are well known. Essentially, the component is cast in a mould and then gradually withdrawn from the furnace in an appropriate manner such that propagation of a single crystal is achieved. Typically, a so-called "pig-tail" selector is used in order to initiate a single grain or crystal growth. The most important consideration with respect to continued propagation of a single crystal within the component is to ensure so-called directional solidification. This is achieved by gradual withdrawal of the component from the furnace such that the temperature gradient is effectively controlled. Generally, the interface temperature between the solid and liquid must be slightly lower than the melting point of the solid and the liquid temperature must increase beyond the interface. To achieve this temperature gradient, the latent heat of solidification must be conducted through the solidifying solid crystal. In any event, ideally the temperature interface should be flat and gradually progress through the component in order to ensure a uniform single crystal is provided with few, if any, defects at the interface. It should also be understood that the solidus/liquidus mix or mushy zone between the solid component and the liquid material should be rendered as stagnant as possible. Unfortunately, most components by their nature are shaped and so provide differing radiation heat effects due to the varying thickness of the component at particular points. These changes render it difficult to fully control the temperature gradient and therefore an unacceptable proportion of components are rejected due to defects formed during casting.

A preferred method of component casting is that known as the lost wax process. This is a traditional technique in which a component is initially formed as a wax structure and then a ceramic coat placed upon that wax structure and allowed to harden. The wax is then removed typically by heating in order to leave the ceramic as a mould for the component. As indicated above, the component is cast from a molten liquid and then allowed to cool and solidify.

SUMMARY OF THE INVENTION

In accordance with the present invention there is provided a method of component casting comprising forming a mould with a displaced deflector element adjacent to a part of a principal mould formation whereby that deflector element controls the rate of heat loss from that part of the principal mould formation for more equalised solidification through the component.

Preferably, forming of the mould is by a lost wax technique.

Normally, the displaced deflector element is horizontal. Possibly, the displaced deflector element is secured to a downpole of the mould.

Possibly, the deflector element is coated for improved radiation with a low emission reflective material. Typically, such low emission material is a magnesium oxide.

Also in accordance with the present invention there is provided a mould for component casting comprising a principal mould formation and a displaced deflector element immediately adjacent a part of the principal mould formation to control in use the rate of heat loss from that part of the principal mould formation for more equalised solidification in use through the component.

Possibly, the mould includes a downpole from which the displaced deflector element is secured. Possibly, the displaced deflector element is coated with a low emission material such as a magnesium oxide. Typically, the displaced deflector element is located with sufficient gap to ensure there is sufficient mould thickness thus there is a gap of approximately 2 mm to 3 mm from the part of the principal mould formation. Generally, the displaced deflector element has a configuration such that there is at least a 15 mm wide overlap with the principal mould formation.

Alternatively, the mould maybe formed by stereo lithography.

BRIEF DESCRIPTION OF THE DRAWINGS

An embodiment of the present invention will now be described by way of example only with reference to the accompanying drawings in which.

DETAILED DESCRIPTION OF PREFERRED EMBODIMENTS

As indicated previously, it is necessary to provide single crystal components for use in certain environments. For example, a turbine blade must be highly resistant to creep at high temperatures and so a single crystal with its lack of grain boundaries is the preferred structure. In order to achieve such a single crystal structure close control of solidification after casting is required. This close control of temperature ensures as the component is removed from a furnace that single crystal growth is propagated. Generally a calm flat temperature boundary or interface is required in order to achieve a single crystal structure with no discontinuities.

One technique for forming a mould suitable for casting of a single crystal component is using a lost wax process. Alternatively, the mould could be formed by a stereo lithography process. A one part mould is produced by coating or investing a wax replica structure of the desired final cast component with a refractory slurry which then sets at room temperature. The wax is then removed generally by melting in order to leave a cavity in the refractory slurry which is a mould of exactly the same shape as the desired component, that is to say the initial wax structure. The cavity is then filled with a molten liquid material to cast the final component. In accordance with the desired single crystal structure it is necessary then to appropriately arrange cooling of the liquid, that is to say solidification, in order to create that desired single crystal structure.

Figure 1:
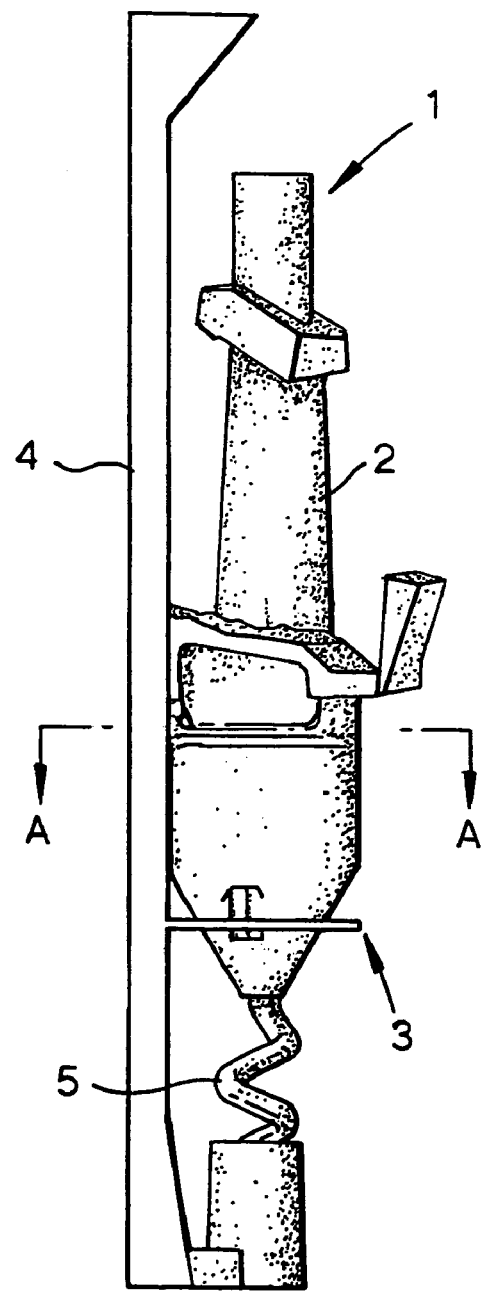
FIG. 1 is a side illustration of a quarter section of a wax preform of a cast component in accordance with the present invention.
Figure 3:
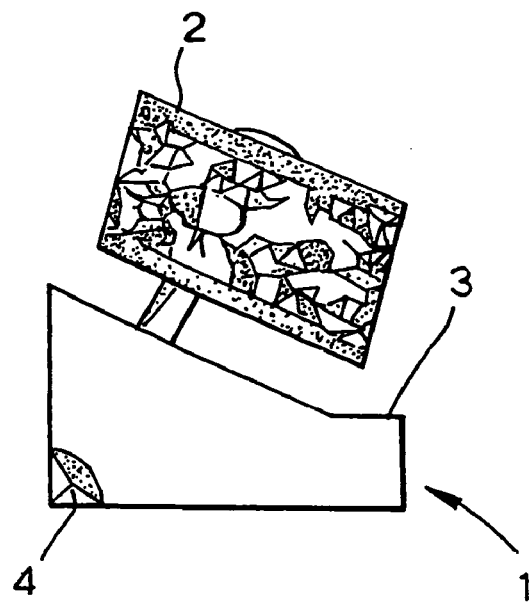
FIG. 3 is a plan view in the direction A—A of the wax preform depicted in FIGS. 1 and 2.
Figure 2:
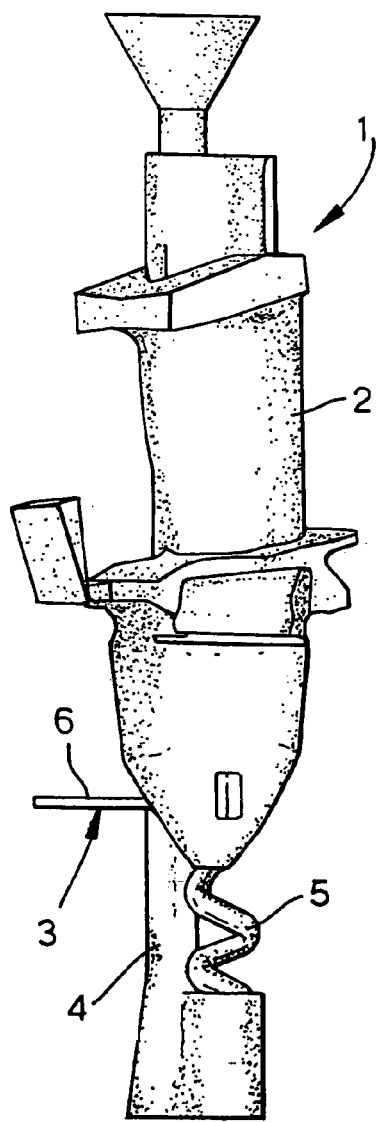
FIG. 2 is a front elevation of the wax preform depicted in FIG. 1.

FIGS. 1, 2 and 3 illustrate a wax form utilised in accordance with the present invention. Thus, the form 1 comprises a principal mould formation 2 equivalent to the shape of the desired cast component and a displaced deflector element 3. The displaced deflector element 3 is secured to a downpole 4 which is also part of the form 1 and the eventual mould. As described previously, this mould structure is formed in wax and a quarter section is shown in FIGS. 1 to 3. Thus, the deflector 3 will generally be presented all round the principal mould formation 2 at a desired position.

As indicated previously, temperature interface control with respect to the solidification of the component is necessary in order to achieve the desired single crystal structure. A technique known as directional solidification is used whereby the mould incorporating the cooling cast component is gradually removed from a furnace in order to precipitate the desired single crystal structure. Generally, a pig-tail selector 5 is used in order to initiate such single crystal structure propagation. Unfortunately, as can be seen in the mould form 1 formed of wax shown in FIGS. 1 to 3 and in particular the principal mould formation 2 which is a replica of the final cast component, the dimensions and thicknesses of that cast component vary along its length. Such variations make it very difficult to achieve the desired flat temperature gradient interface in order to achieve the desired single crystal structure. In particular as depicted in FIGS. 1 to 3 root portions of the principal mould formation 2 are generally narrower than other parts of that formation 2 such that there can be a variable temperature gradient through the cross-section of the formation 2 and therefore cast component in these areas.

In accordance with the present invention the deflector element 3 is positioned about the root part of the formation 2 whereby the temperature gradient across the component at that position is maintained as substantially flat. Thus, central parts of the cast component will be at approximately the same temperature as surface parts of that component despite the relatively thin cross-section of the component. In such circumstances, the whole width and cross-section of the component is substantially at the same temperature and will cool at the same rate to ensure better single crystal propagation or directional solidification without defects.

Figure 4:
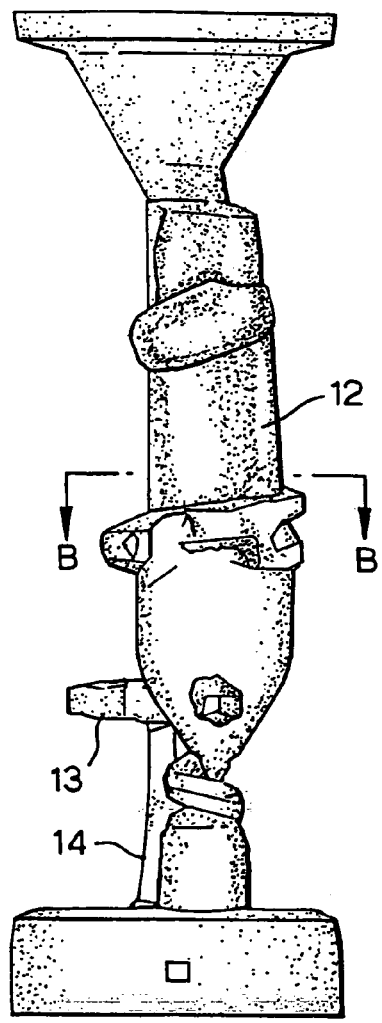
FIG. 4 is a front view of a part of a mould in accordance with the present invention.
Figure 5:
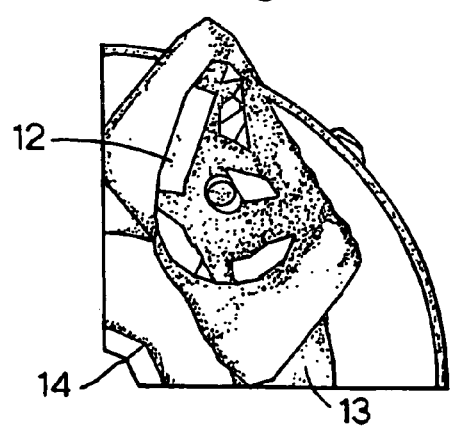
FIG. 5 is a plan view in the direction B—B of the part of the mould depicted in FIG. 4; and, FIG. 6 is a three quarter view, one component removed, of a mould in accordance with the present invention.

The deflector element 3 is formed by providing upon the downpole 4, during formation of the wax replica for the finished component, a shaped protrusion which extends towards the principal mould formation 2 such that a surface 6 is adjacent but displaced from an overlap zone of the principal mould formation 2. In accordance with the usual lost wax process the structure shown in FIGS. 1 to 3 is then coated with a ceramic slurry in order to provide the structure as shown in FIGS. 4 and 5. This comprises coating the wax with several layers of ceramic slurry and stucco and allowing those layers to solidify. The wax is then removed to leave the mould behind. Molten metal is then placed in the mould and allowed to solidify in accordance with the control regime as described previously in order to create a single crystal. This technique is known as single crystal or directional solidification (CDS). Directional solidification furnaces usually comprise one or two heater zones, an insulation ring or baffle and a lower cooling zone. The mould in which the casting is solidifying is slowly withdrawn from the heater zone into the cooling zone at a predetermined rate in order to produce uni-axial heat flow in the opposite direction to the desired crystal growth. In such circumstances, it will be appreciated that variations in the cross-sectional area of the component can create convective instabilities, local thermal gradients and other problems which in turn can create defects within the crystal structure.

In accordance with the present invention and as depicted in FIGS. 4 and 5, the deflector element 13 is designed to control the radiative heat flux from the relatively narrow component part of the principal mould formation 12 cavity during solidification. This control is achieved by modifying the radiation view factors of local overlap areas of the principal mould formation 12. In particular, local areas specifically on the inner or downpole 14 side of the principal mould formation 12 where a traditional furnace baffle would be ineffective. As can be seen in the Figures the deflector element (3, 13) essentially comprises a radiation deflector in the form of a horizontal plate mounted upon the downpole (4, 14) at a position below an identified temperature gradient problem area of the casting. The deflector (3, 13) is added during the wax form arrangement stage as a thin wax plate attached to the downpole 4. Alternatively, the deflector (3, 13) may be a ceramic plate instead of a wax plate provided a sufficient mould thickness is created and it has the correct shape. The deflector (3, 13) ideally will follow the contour of the opposed overlap part of the component principal mould formation (2, 12) to avoid higher heat loss around the surface of that part. It is possible to use a simple disc as the deflector (3, 13) but this would provide a lower benefit. Generally, the deflector (3, 13) is formed by the wax protrusion or plate will be processed or modelled as a 2 mm to 3 mm thick plate of wax with a nominal reflector thickness and a coating with the layer of ceramic slurry and stucco in the order of 15 mm. The thickness can be between 1 to 3 mm, a vertically thin feature is required, but thickness is governed by the strength of the wax used, again a gap of 15 mm is not specific to the present invention. When the preferred lost wax technique is used such a gap allows a mould shell thickness to form about the wax pattern of sufficient strength for casting.

As indicated previously, the effect of the deflector (3, 13) is to reduce the radiation view factor for the principal moulding formation (2, 12) on the inner downpole (4, 14) side of the casting within that principal moulding formation (2, 12). In such circumstance, there is a heat flux from these protruding features which in turn balances the temperature gradient at the critical solid/liquid interface. The deflector (3, 13) reflects heat back onto the protruding feature of the casting (principal mould feature) so reducing the radiative heat loss from these features. A more controlled temperature gradient at this solid liquid interface reduces the risk of secondary grain formation caused by convective flow instabilities and other problems within the still fluid casting material. The deflector (3, 13) also reduces other defects caused by low thermal gradients, such as linear eutectics in DS castings and shrinkage porosity. Thus, defects as a result of a number of problems are relieved.

It will be appreciated by allowing more complex component structures to be used additional features can be cast into the component rather than requiring those features to be achieved by subsequent machining of the cast component. Clearly, such machining also requires removal of material which is wasteful and expensive. Such machining may also introduce stress fracturing which may be exploited by temperature cycling in use of the component and so cause premature failure.

The present deflector (3, 13) is created during the wax formation stage and so unlike fixed baffles within a furnace can be placed at any location where there is an identified need. It will also be understood that the deflector (3, 13) need not follow the extreme outer profile of the mould so the reflector can be placed anywhere that there is a consistent repeatable defect identified with variable overlap and spacing determined as necessary for temperature control. The deflector (3, 13) can be easily produced upon the downpole 4 during the wax form fabrication stage or as an additional piece added to the downpole 4 during such wax structure fabrication. Essentially, the deflector is formed by the already present wax and ceramic slurry/stucco combination and in such circumstances does not significantly add to cost particularly in comparison with baffles and more sophisticated twin zone heaters used in existing furnace arrangements in order to overcome the described defect problems due to solid liquid interface temperature variations. The deflector could be made from any material as long as it either does not react with the cast alloy, or can be removed during dewax or pre-firing of the mould, can be shelled or coated to form the mould, or can be produced as a feature in a stereo lithographic ceramic mould.

Figure 6:
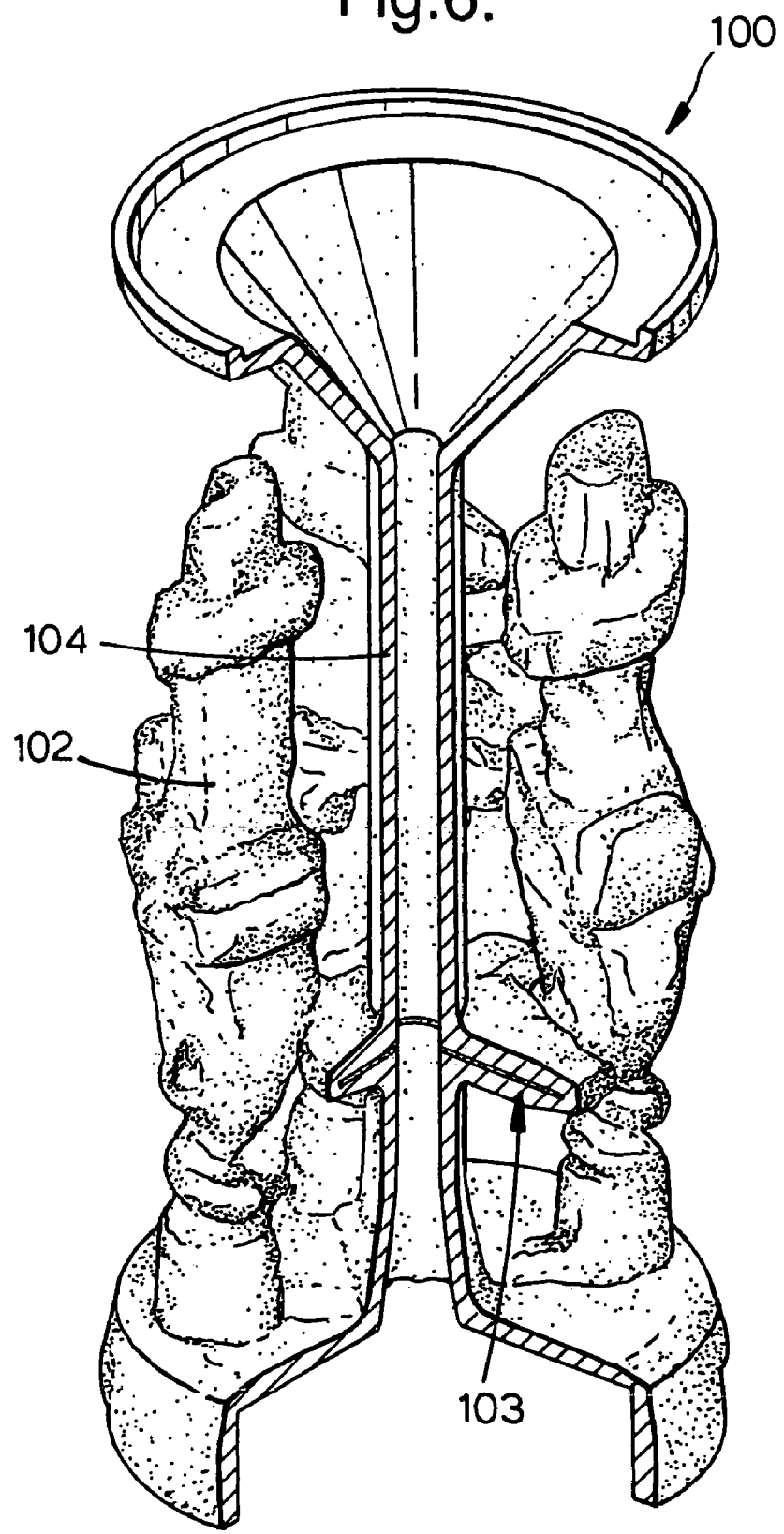

FIG. 6 illustrates a three quarter part front perspective of a practical mould 100 in accordance with the present invention, that is to say with one component mould removed. Thus, it can be seen in this embodiment that the mould in use presents four principal mould formations 102 located substantially perpendicular to each other on a base plinth. However, the deflector can be used with any number of components on a mould but may be limited by the size of the component, or the size of the furnace used to cast the component. The deflector must follow the outer profile of the component and is positioned in a desired location to prevent defects. The deflectors 103 are formed as a downpole 104 to be presented at appropriate positions for temperature gradient stabilisation as described above.

It will be appreciated a number of deflectors in accordance with the present invention could be utilised at different positions relative to the principal moulding formation in order to ensure appropriate temperature control during solidification of the casting. The specific shape, size and location of the reflector is determined through a radiative modelling procedure in order to best maintain temperature to achieve the consistency of temperature across the solid-liquid interface through the component as it is gradually withdrawn from the furnace.

With a turbine blade, the present deflector will generally be used with respect to the thermal gradient in the root fir tree or shank neck regions of the casting which forms the turbine blade. As indicated previously, these are the parts of the turbine blade where the reduced cross-sectional area can result in variable thermal gradient and convection flow induced defects. Generally, root and shank parts are the biggest problem areas on a turbine blade, but a deflector could be used on any directional solidification or single crystal formed component. Deflector being located below any feature which is the source of a solidification defect.

In order to enhance the performance of the deflector it will be appreciated that once the layer of ceramic slurry and stucco has dried and hardened, an appropriate high emission material such as a magnesium oxide paint may be applied to the deflector in order to further enhance its radiative abilities. It will be understood that it is heat from the casting within the principal mould formation which is reflected back to that moulding in order to control temperature as required to resist grain boundary formation. It will be understood that radiative heat loss is the main manner of cooling of the casting within the principal moulding formation as the mould is generally within a vacuum furnace whereby convective airflows about the mould are removed to again avoid differential cooling along the length of the casting within the principal mould formation. Nevertheless, generally the upper part of the furnace and therefore the principal mould formation and casting will be hotter than the lower part due to positioning of the heaters, etc. Thus, the mould is gradually removed from the furnace by a downward motion thus gradually cooling the casting in the principal moulding formation.

Although mainly described with reference to use of a downpole it will be understood that separate upstanding legs may be used in the mould where space is available in order to appropriately present the deflector element to the principal mould formation. Similarly, although described with regard to a turbine blade other components such as a seal or nozzle vane could be made using the present method and/or mould.

Whilst endeavouring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

What is claimed is:

1. A mould for component casting using a directional solidification process comprising a principal mould formation to define a cavity that is the shape of a desired cast component, said mould further including a portion that defines a cavity that is in the shape of a downpole, said mould further comprising a mould formation mounted upon said downpole portion to define a cavity that is the shape of a deflector element in the form of a plate disposed about a part of said principal mould formation to control, during casting, radiative heat flux from said part of said principal mould formation.

2. The mould for component casting as claimed in claim 1, wherein said formation that defines a cavity that is the shape of a deflector element is arranged such that said deflector element is horizontal during casting.

3. The mould for component casting as claimed in claim 1, wherein said mould formation that defines a cavity that is the shape of a deflector element is coated with a low emission material as a coating material.

4. The mould for component casting as claimed in claim 3, wherein said coating material is a magnesium oxide paint.

5. The mould for component casting as claimed in claim 1, wherein said mould is so configured that said deflector element is approximately 2 mm to 3 mm thick.

6. The mould for component casting as claimed in claim 1, wherein said deflector element has a configuration such that there is at least a 15 mm wide overlap with said principal mould formation.

7. The mould for component casting as claimed in claim 1, wherein said mould is formed from a ceramic-based material located about a wax preform of the configuration of the desired cast component.

8. The mould for component casting as claimed in claim 1, wherein said mould is formed by stereo lithography.

* * * * *